United States Patent
Schmid et al.

(10) Patent No.: US 9,546,434 B2
(45) Date of Patent: Jan. 17, 2017

(54) HIGH-TEMPERATURE PROCESS IMPROVEMENTS USING HELIUM UNDER REGULATED PRESSURE

(75) Inventors: Frederick Schmid, Marblehead, MA (US); David B. Joyce, Marblehead, MA (US); John Brouillette, Hudson, NH (US); Daniel P. Betty, Andover, MA (US); Ryan Philpott, Andover, MA (US)

(73) Assignee: GTAT Corporation, Merrimack, NH (US)

( * ) Notice: Subject to any disclaimer, the term of this patent is extended or adjusted under 35 U.S.C. 154(b) by 1241 days.

(21) Appl. No.: 12/873,388

(22) Filed: Sep. 1, 2010

(65) Prior Publication Data

US 2011/0048316 A1    Mar. 3, 2011

Related U.S. Application Data

(60) Provisional application No. 61/239,228, filed on Sep. 2, 2009.

(51) Int. Cl.
*C30B 11/00* (2006.01)
*C30B 15/00* (2006.01)
*C30B 29/20* (2006.01)

(52) U.S. Cl.
CPC .............. *C30B 11/00* (2013.01); *C30B 15/00* (2013.01); *C30B 29/20* (2013.01); *Y10T 117/1008* (2015.01); *Y10T 117/1024* (2015.01)

(58) Field of Classification Search
CPC .................................. C30B 11/00; C30B 15/00
USPC .................................. 117/11, 13, 54, 83
See application file for complete search history.

(56) References Cited

U.S. PATENT DOCUMENTS

| | | | | |
|---|---|---|---|---|
| 3,653,432 A | * | 4/1972 | Schmid et al. | 117/83 |
| 3,898,051 A | * | 8/1975 | Schmid | 117/83 |
| 3,998,686 A | * | 12/1976 | Meiling et al. | 117/33 |
| 4,096,025 A | * | 6/1978 | Caslavsky et al. | 423/625 |
| 4,256,530 A | * | 3/1981 | Schmid et al. | 117/13 |
| 4,330,362 A | * | 5/1982 | Zulehner | 117/33 |
| 5,431,124 A | | 7/1995 | Machida et al. | |
| 2002/0083887 A1 | * | 7/2002 | Holder | 117/13 |
| 2008/0053372 A1 | * | 3/2008 | Anttila et al. | 117/200 |

FOREIGN PATENT DOCUMENTS

FR    2347974    10/1977

* cited by examiner

*Primary Examiner* — Matthew Song
(74) *Attorney, Agent, or Firm* — Parker Ibrahim & Berg LLC; Stephen D. LeBarron (57) ABSTRACT

A method for minimizing unwanted ancillary reactions in a vacuum furnace used to process a material, such as growing a crystal. The process is conducted in a furnace chamber environment in which helium is admitted to the furnace chamber at a flow rate to flush out impurities and at a predetermined pressure to achieve thermal stability in a heat zone, to minimize heat flow variations and to minimize temperature gradients in the heat zone. During cooldown helium pressure is used to reduce thermal gradients in order to increase cooldown rates.

23 Claims, 7 Drawing Sheets

HIGH-TEMPERATURE PROCESS IMPROVEMENTS USING HELIUM UNDER REGULATED PRESSURE

CROSS-REFERENCE TO RELATED APPLICATIONS

This application claims priority from U.S. Provisional Patent Application Ser. No. 61/239,228 filed Sep. 2, 2009 for High-Temperature Process Improvements Using Helium Under Regulated Pressure.

BACKGROUND OF THE INVENTION

Field of the Invention

This invention generally relates to the processing of materials in a high-temperature operating environment. More specifically this invention relates to the production of crystalline material in high-temperature vacuum furnaces.

Description of Related Art

Although the following discussion relates to the production of crystals in a high-temperature vacuum furnace, it will be apparent that the methods and apparatus disclosed herein are applicable to any high-temperature operating environment used for the production of various products including, but not limited to, the production of various glasses, amorphous materials, multi-crystalline ingots, such as silicon ingots, and thin films.

A process for producing crystals in an environment, such as found in a high-temperature vacuum furnace, can produce any or all of three general categories of unwanted ancillary or secondary reactions that can affect the final crystal quality. They are: (1) high-temperature chemical reactions, (2) a decomposition of unstable compounds and (3) sublimation or vaporization of certain elements.

High-temperature chemical reactions typically involve carbon or refractory metals such as molybdenum and tungsten, which are often used in the construction of high temperature furnaces. If such reactions occur, they can degrade the furnace. Examples of reactions involving graphite-containing furnaces include:

$$C(s)+2Mo(s)\rightarrow Mo_2C \quad (1)$$

and $$H_2O(g)+C(s)\rightarrow CO+H_2(g) \quad (2)$$

The carbon monoxide can then react with any refractory metals and thereby form carbides and volatile species.

Molybdenum crucibles also react with $Al_2O_3$ at high temperatures in vacuum to form:

$$Al_2O_3(s)+Mo(s)\rightarrow MoO_2(g)+AlO(g)+Al(g) \quad (3)$$

and other compounds as well through similar reactions.

Silicon in a silica crucible operating at a melt temperature of 1412° C. and at a pressure below 10 Torr reacts to form gaseous SiO by the reaction:

$$SiO_2(s)+Si(s)\rightarrow 2SiO(g) \quad (4)$$

At about 1400° C. gaseous SiO reacts with carbon at pressures below 10 Torr to produce highly reactive carbon monoxide (CO) and SiC. That is:

$$2C(s)+SiO(g)\rightarrow SiC(s)+CO(g) \quad (5)$$

Silicon carbide can seriously degrade the quality of silicon grown from the melt.

Also, CO reacts with silicon below 10 Torr to form carbon and silicon monoxide according to:

$$CO(s)+Si(s)\rightarrow C(s)+SiO(g) \quad (6)$$

Such a reaction can lead to an unwanted deposition of SiO gas onto surfaces in the colder regions of the furnace. In addition, silicon carbide can seriously degrade the quality of silicon grown from the melt.

At elevated operating temperatures certain compounds become unstable and decompose. For example:

$$2MgO(g)\rightarrow 2Mg(s)+O_2(g) \quad (7)$$

whereby free oxygen can react with both the materials used in the furnace itself and with the material being processed in the furnace to form oxides.

As another example, spinel decomposes to magnesium oxide and aluminum oxide according to:

$$MgAl_2O_4(s)\rightarrow MgO(g)+Al_2O_3(s) \quad (8)$$

where MgO reacts as described above.

Sublimation, or vaporization, occurs when certain elements or compounds are elevated to high temperatures. As known, all metals and some refractory materials are prone to vaporize or sublime at high temperatures. Graphite will sublime at a high temperature into carbon vapor. For example, graphite will sublime into carbon vapor above 2200° C. The carbon vapor can react with a crucible and contaminate the crucible contents.

In crystal manufacturing processes, ancillary reactions, such as reaction (1) above and sublimation, can produce gaseous species. As known, such gas can be captured in the material being processed causing a crystal, for example, to have imperfections, such as inclusion or bubbles, which produces undesirable light scatter.

In high-temperature environments, heating elements are also susceptible to the existence of "hot spots," which are due to variations in resistivity in the heating element or power source variations, or "cold spots," which are caused, for example, by leaky insulation. During processing, hot and cold spots can result in non-uniform or non-symmetrical crystal growth. During crystal growth and cooldown, hot spots and/or cold spots produce thermal stress gradients in the crystal that can cause stress defects including dislocations that cause lattice distortion and/or cracking. As known, the existence of fine particles of previous reaction products or of furnace construction materials, such as graphite felt or moisture, that react inside a heat zone can degrade furnace performance and even obscure viewing through viewports.

What is needed is a process and control thereof that minimizes unwanted ancillary reactions and unwanted temperature gradients during processing in high-temperature environments.

SUMMARY

In accordance with one aspect of this invention, a method of producing a crystalline material is disclosed that comprises the steps of a) loading a crucible having melt stock and an optional seed crystal into a heat zone of a furnace; b) evacuating the heat zone of the furnace to an operating pressure value; c) heating the heat zone of the furnace to at least partially melt the melt stock; d) further heating the heat zone of the furnace to a maximum temperature to fully melt the melt stock and optionally to partially melt the seed crystal; e) growing the crystalline material from the fully melted melt stock and optionally further from the partially melted seed crystal by cooling the heat zone; and f) removing the crystalline material from the furnace. The method further comprises the steps establishing a flow rate of at least one non-reactive gas into the heat zone of the furnace followed by establishing a pressure of the at least one non-reactive gas in the heat zone of the furnace above the operating pressure, which occurs prior to the step of growing the crystalline material.

In accordance with another aspect of this invention, a furnace for producing a crystalline material is disclosed that comprises a heat zone; a vacuum pump assembly connected to the furnace that maintains a vacuum in the heat zone; at least one heater surrounding the heat zone that provides heat to the heat zone; a non-reactive gas system connected to the furnace that supplies at least one non-reactive gas into the heat zone; and a non-reactive gas regulating system connected to the furnace and to the vacuum pump assembly that establishes and maintains a flow rate and a pressure of the non-reactive gas in the heat zone. The furnace may further comprise a heat exchanger.

In accordance with another aspect of this invention, a method is disclosed for stabilizing the environment in a high-temperature vacuum furnace for producing a crystal or ingot wherein production is subject to at least one unwanted temperature and pressure dependent ancillary reaction, said method comprising: A) establishing a reaction pressure value dependent upon the reaction vapor pressure for each of the at least one ancillary reaction, B) directing gas through the heat zone wherein the gas has the characteristics of being a non-reactive in the heat zone environment and of small molecular size, high specific heat and high heat conductivity, and C) regulating the pressure of the non-reactive gas in the heat zone at the established reaction pressure value.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings and in which:

DESCRIPTION OF ILLUSTRATIVE EMBODIMENTS

Figure 1:
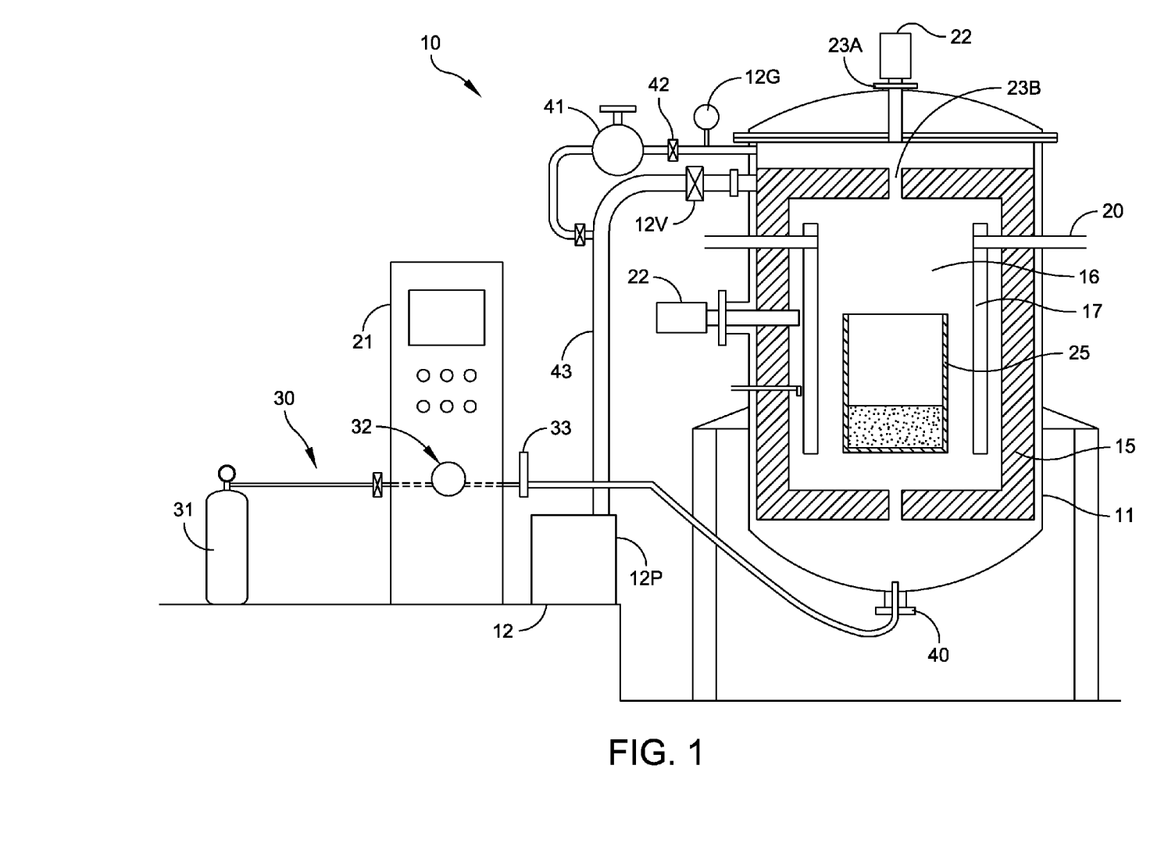
FIG. 1 is a block diagram that depicts the application of this invention to a first type of furnace.
Figure 2:
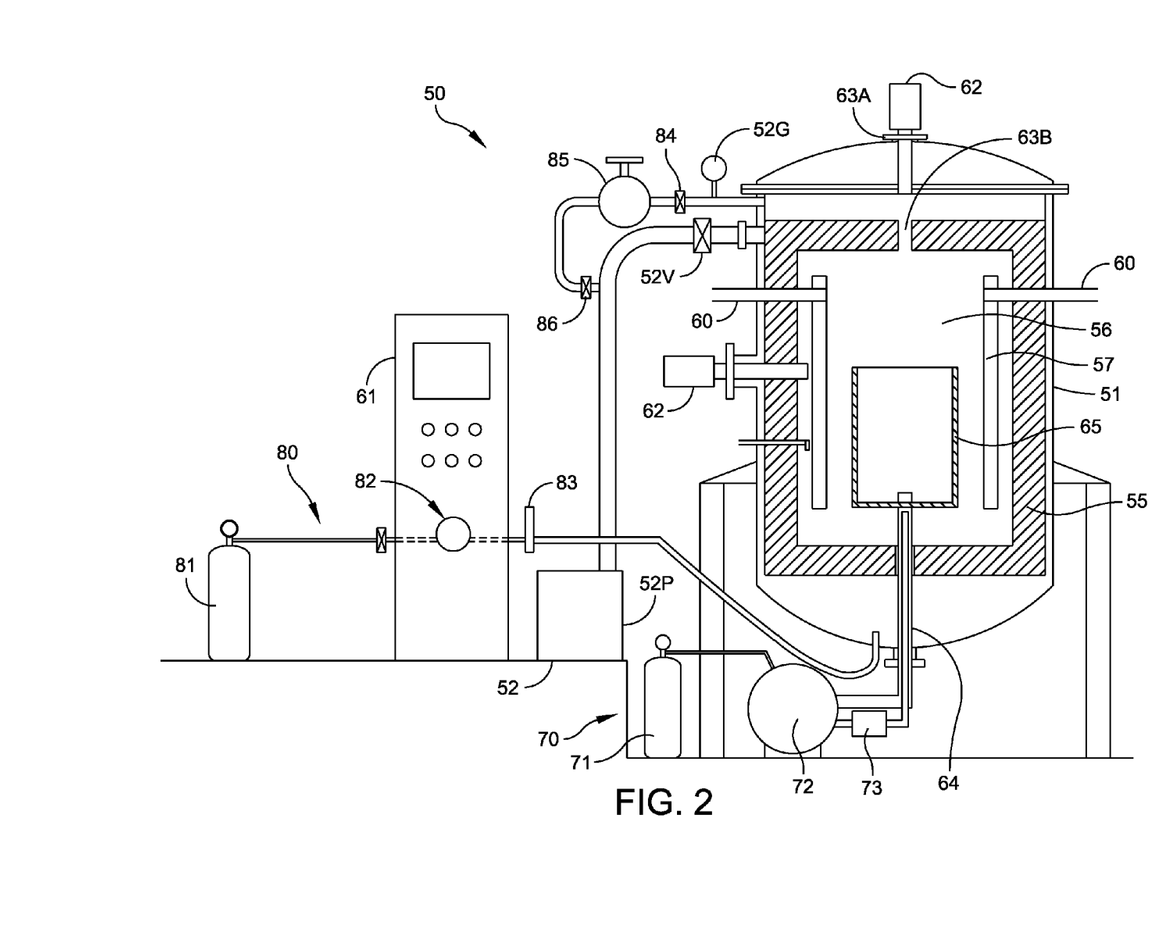
FIG. 2 is a block diagram that depicts the application of this invention to a second type of furnace.

Two specific furnaces described in detail are a material processing furnace in FIG. 1 and a heat exchanger method (HEM) furnace in FIG. 2. It will be apparent, however, that this invention can also be adapted for growing ingots by directional solidification or crystals in Bridgman, Stockbarger, Thermal Gradient Freeze, Top Seeded Kyropolous, Thermal Gradient Technique and other furnaces where temperature stability and uniformity and control are important.

Material Processing Furnace

Now referring to FIG. 1 a furnace system 10 adapted for processing materials in accordance with this invention includes a vacuum tight furnace chamber 11. A vacuum pump assembly 12 evacuates the interior of the furnace chamber 11 and is shown schematically as comprising a vacuum pump 12P, a main vacuum gauge 12G for providing measurements for a vacuum controller and a vacuum valve 12V. Such vacuum systems are known in the art.

In this embodiment, insulation 15 in the furnace chamber 11 forms an insulated heat zone 16. The insulation 15 can be composed of a graphite-based material, such as graphite felt or other refractory material. The heat zone 16 that can be formed by any of a number of known means or structures used in various furnace designs.

The heat zone 16 in FIG. 1 includes a graphite resistance heater 17 with leads 20 that extend to a power source in a furnace control cabinet 21. At least one pyrometer 22 measures the process temperature through a window and port, such as window 23A and port 23B, to provide a temperature input signal for process control. In this embodiment a properly conditioned crucible 25 positioned in the heat zone 16 contains a mix of materials that constitute a melt stock. The resistance heater 17 surrounds the crucible 25. Such heaters and controls are known in the art.

In this embodiment, the furnace system 10 is adapted to incorporate a non-reactive gas system 30. The gas system 30 supplies a non-reactive gas into the volume defined by the furnace chamber 11 including the heat zone 16. The gas system 30 includes a supply tank 31 or other source. A flow controller 32 includes a flow monitor 33 and controls the gas flow rate into the furnace chamber 11. Conventional flow control systems can be adapted to perform this function.

The gas system 30 supplies the non-reactive gas into the heat zone 16, preferably through a port 40 at the base of the furnace chamber 11 with vacuum valve 42 closed. A pressure regulator 41 controls the gas pressure in the furnace chamber 11 by bleeding gas to the vacuum pump assembly through a vacuum line 43 in a controlled manner. As will be described, at some point during operations and in accordance with this invention, the main vacuum valve 12V is closed and the valve 42 is open to provide a pressure regulated exhaust path from the vacuum chamber 11 to the vacuum pump 12. As a result, the pressure in the heat zone 16 is allowed to increase to, and thereafter be maintained at, a predetermined pressure. Systems for providing gas at variable flow rates and at a predetermined pressure are known in the art.

Heat Exchanger Method (HEM) Furnace

FIG. 2 depicts a HEM (Heat Exchanger Method) furnace 50. Variations of such a furnace are described in U.S. Pat. Nos. 3,653,432 and 3,898,051 and 4,256,530 and 4,840,699 and 7,344,596. In FIG. 2, the furnace system 50 includes a vacuum tight furnace chamber 51. A vacuum pump assembly 52 evacuates the interior of the furnace chamber 51 and is shown as comprising a vacuum pump 52P, a vacuum gauge 52G for providing measurements for vacuum control and a main vacuum valve 52V as known in the art. Insulation 55 in the furnace chamber 51 defines a heat zone 56 which can be constructed in accordance with any number of variations.

The heat zone 56 is bounded by a graphite resistance heater 57 with leads 60 that extend to a power source typically associated with a furnace control cabinet 61. At least one pyrometer 62 measures the process temperature through a window and port, such as window 63A and port 63B, to provide a temperature input signal for process control. Heat exchanger 64 can comprise a closed-end refractory metal tube with an internal tube to inject a coolant gas, particularly helium, at controlled rates to extract heat from the bottom center of the crucible. The heat exchanger 64 supports a properly conditioned crucible 65 that is surrounded by the resistance heater 57. The crucible 65 contains a mix of melt stock materials that will produce a final crystal.

In FIG. 2, the heat exchanger 64 provides selective cooling by connection to a helium cooling system 70 with a helium supply tank 71 or other source. A helium recirculation pump 72 pumps helium gas to a mass flow controller 73 or valve that controls the gas flow rate into the heat exchanger 64. The combination of the variable temperature control of the heater 57 and variable helium flow control to the heat exchanger 64 enables heat to be extracted directionally from the seed and melt in the bottom of the crucible for good directional solidification or crystal growth. That is, the heat exchanger 64 produces a temperature in the bottom center of the crucible at the seed crystal for single crystal growth by increasing the helium flow to reduce the heat exchanger temperature in a controlled manner to produce a desired solid-liquid interface shape and growth rate. Single crystal growth thereby occurs under highly controlled liquid and solid temperature gradients which efficiently segregate impurities into the liquid as the solid-liquid interface advances. Crystal growth methods where crystal growth from the bottom of the crucible like Bridgman, Stockbarger and other crystal-growth and ingot-growth methods where crystal growth occurs inside the crucible will benefit by using a heat exchanger 64 or other equivalent device with regulated helium flow to achieve the best process condition for each type of furnace and/or material being processed.

In this embodiment, the furnace system 50 is adapted to incorporate a helium gas, or other non-reactive gas, system 80. The gas system 80 comprises a supply tank 81 or other source. A mass flow controller 82 and flow monitor 83 control the rate at which the gas flows through a conduit 84 to be admitted into the furnace chamber 51, preferably at the bottom.

Like the apparatus in FIG. 1, the furnace system 50 operates under a vacuum initially established when the vacuum system 52 evacuates the heat zone 56 through the vacuum valve 52V. A second evacuation path is provided through a control valve 84 and pressure regulator 85 that exhausts through a valve 86 into the vacuum pump system 52. At some point during operations and in accordance with this invention, the main vacuum valve 52V closes and the valve 84 opens to provide a controllable gas pressure within the heat zone 56.

Process Control

In accordance with one aspect of this invention, a method of producing a crystalline material is disclosed that comprises the steps of providing a crucible having a melt stock into a heat zone of a furnace and evacuating the heat zone of the furnace to an operating pressure value, which is typically less than 1 Torr. Optionally, the crucible may also contain a seed crystal. In this method, the heat zone of the furnace is heated to at least partially melt the melt stock and then further heated to a maximum temperature to fully melt the melt stock and optionally to partially melt the seed crystal, if used. The method further comprises the step of growing the crystalline material from the fully melted melt stock and optionally further from the partially melted seed crystal by cooling the heat zone. The crystalline material can then be removed from the furnace.

The method of the present invention further comprises the steps establishing a flow rate of at least one non-reactive gas into the heat zone of the furnace followed by establishing a pressure of the at least one non-reactive gas in the heat zone of the furnace above the operating pressure, which occurs prior to the step of growing the crystalline material, including prior to the step of melting the melt stock. In accordance with this invention and as previously discussed, process control is achieved by the use of helium or any other gas that is non-reactive in the furnace environment and that has a small molecular size, high specific heat and high heat conductivity. Non-reactive gases that are candidates for use in accordance with this invention include argon, helium and nitrogen and, in oxygen-free environments, hydrogen.

In a preferred embodiment, helium is selected because it has significant advantages. It does not react at high temperatures. It has better heat conductivity and higher specific heat than argon and nitrogen, and therefore it provides better temperature stability. It has a smaller molecular size and better flow properties than argon. This enables good convective heat transfer and provides better diffusion of gas out of materials in a vacuum. Although hydrogen has better heat conductivity and smaller molecular size than helium, it is a reducing gas and explosive when in contact with oxygen, particularly at the high operating temperatures and conditions of these processes and cannot be used for processing most materials. Therefore, the following process control is couched in terms of the use of helium gas. However, as will now be apparent argon or nitrogen can be used for some processes where heat flow and/or temperature uniformity are not so critical to provide similar effects relative to helium.

As discussed in more detail above, processes for producing crystals in a high-temperature vacuum furnace can produce a variety of unwanted ancillary or secondary reactions that can affect final crystal quality. Each unwanted ancillary reaction has two properties, namely: (1) a reaction temperature and (2) a reaction vapor product, which can be a gas or solid. The reaction temperature is the minimum temperature at which an unwanted ancillary reaction occurs. If the reaction product is gaseous, the reaction vapor pressure, or reaction pressure, is that pressure above which the ancillary reaction is suppressed. Specific values for reaction temperatures and vapor pressures are known for the different reactions encountered in the above-identified and other furnace systems.

Decomposition reactions can often be suppressed by imposing an inert gas pressure greater than or equal to the total vapor pressure of the decomposition products. For example, carbonate decomposition reactions proceed at significant rates only when the decomposition vapor pressure of $CO_2$ is greater than the total pressure, even when the partial pressure of $CO_2$ is less than equilibrium. Similarly, the decomposition of $Si_3N_4$ can be suppressed if a total pressure greater than the vapor pressure of $Si_3N_4$ is maintained.

If there is concern with only one unwanted ancillary reaction, a reaction threshold can be established for the reaction temperature and vapor pressure for that unwanted ancillary reaction. If multiple unwanted ancillary reactions are involved and if the operational temperature is higher than the threshold reaction temperature, the pressure must be higher than the vapor pressure of each involved ancillary reaction. See Schmid, *Origin of SiC Impurities in Silicon Crystals Grown from the Melt in Vacuum*, J. Electrochem. Soc. 126 (1), 935 (1979).

A vapor pressure threshold is selected to be greater that the largest value of the reaction vapor pressures and a minimum helium flow rate is established to flush out impurities and contaminants. As will be apparent to those of ordinary skill in the art, the reaction temperature and pressure thresholds involve kinetics and are determined by thermo-chemical calculations, experience and experimentation for any specific reaction. In the following discussion, the analysis of potential unwanted ancillary reactions will produce an established reaction temperature value and an established reaction pressure value which are used as critical values for the process.

Figure 3:
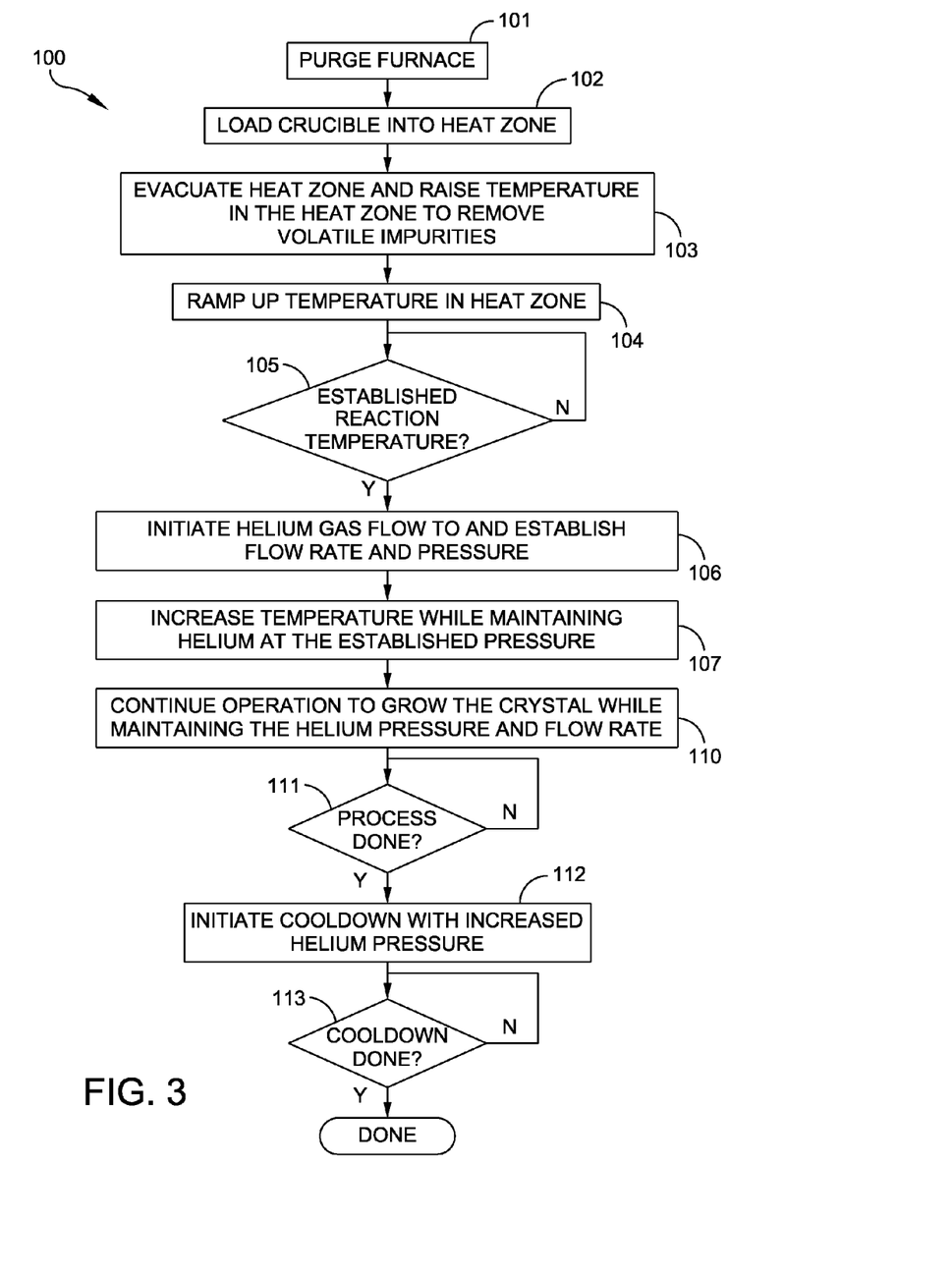
FIG. 3 is a basic flow diagram that outlines the methodology for process control according to this invention that can be applied to various furnaces including those in FIGS. 1 and 2.

Now referring to FIG. 3, a process 100 of this invention begins with a typical series of preliminary steps 101 through 104 that are known in the art. In this specific embodiment step 101 represents the process of purging the furnace to assure that it is clean. At the end of step 102 the crucible is in the heat zone of the furnace and contains the materials to be processed. Step 103 represents an evacuation of the heat zone and bakeout temperature to remove any volatile impurities. After conditioning in step 104 the temperature in the heat zone begins to ramp up to process the contents in the crucible.

When, in step 105, it is determined that the temperature has ramped to the established reaction temperature, in step 106 helium gas flow is initiated to bring the pressure within the heat zone to the established flow rate and reaction pressure to minimize gas evolution. The helium gas flow rate is sufficient to maintain a precise regulated pressure and flush out contaminants that could contaminate the heat zone and the materials being processed in the heat zone. Typically a vacuum furnace is operated in the range of 5 to 250 Torr of helium gas depending on the material being processed. Maintaining a pressure in this range is readily achieved with conventional systems with the helium flow into and out of the furnace chamber.

The flow rate should assure that the helium is heated sufficiently when it enters the heat zone from the bottom of a furnace chamber. As known, increased heat transfer in the heat zone from hotter regions to cooler regions will increase to minimize temperature gradients thus achieving greater temperature uniformity in the heat zone. The overall heat transfer from the heat zone to cooler portions of the furnace chamber will also increase. As will be apparent, any such increase in heat transfer will require the heater control to supply more power. Helium, with its good heat conductivity and good flow characteristics, enhances heat transfer in the heat zone and increases heat flow through the insulation to the inside wall of the chamber. This, in turn, requires higher power. Heat flow can be increased or decreased with increases or decreases in pressure. For any given process, the minimum pressure should be selected to provide good thermal uniformity in the heat zone while minimizing the power requirements and assuring that the flow rate is sufficient to sweep impurities out of the heat zone. The good flow characteristics cause helium to flow through openings from the inside to outside of the heat zone. It is important to minimize openings out of the heat zone since the openings act as chimneys, and this increases the required power and causes temperature variations. Ideally, any openings should be minimized and symmetrical in the heat zone.

Once the gas flow reaches its established parameters in step 107 the heat zone temperature increases while controlling the helium pressure with a regulator that adjusts the helium flow to the vacuum system.

Step 110 represents the continued operation for growing the crystal while maintaining the helium pressure and flow rate. The pressure regulators 41 and 85 in FIGS. 1 and 2 and/or a pressure transducer with related controls provide the necessary pressure control.

During step 110, as an example, there is a strong reduction potential in graphite resistance furnace chambers. If there were an oxygen leak, carbon vapors could react with oxygen to form carbon monoxide. Carbon monoxide could then react with and reduce the contents in the crucible being processed.

In certain processes involving aluminum oxide, the crucible may be composed of molybdenum. This will cause a reduction of aluminum oxide into suboxides and form molybdenum oxide. Helium pressure applied in accordance with this invention minimizes the reduction of aluminum oxide and reduces light scatter in the resulting crystal.

It is believed that the helium atmosphere also suppresses vaporization of metals, refractory materials, graphite or carbon at high temperatures. These vapors can react to deteriorate furnace components, contaminate and/or reduce the materials being processed. It appears that maintaining helium pressure stabilizes heat zone temperature by minimizing temperature gradients and fluctuations that are sources of dislocations and lattice distortion.

When, in step 111, it is determined that the growth has been completed, cooldown is initiated in step 112. In accordance with this invention this cooldown occurs at an increased helium pressure, typically by increasing the helium pressure above that used during step 110 (i.e., the established reaction pressure value). Increasing the pressure stabilizes the temperature in the heat zone by minimizing hot and cold spots. It has also been found that increasing the pressure of the helium or other gas increases the heat loss to the furnace's water-cooled chamber. This reduces the cooldown time of step 113 by minimizing the gradients in the heat zone which increases the likelihood of successful annealing and may reduce the overall cycle time.

With this understanding of the process of this invention as described above, it will be helpful to describe the benefits of this invention by disclosing two specific examples of a process for growing a sapphire crystal without the benefit of this invention and then disclosing a specific example of a process incorporating this invention and the crystal produced thereby.

As known, sapphire crystals are useful as substrates in the production of light emitting diodes. As also known, sapphire crystals used for this purpose must have a lattice distortion resulting from high dislocation density and light scatter site density that are below predetermined levels.

Figure 4:
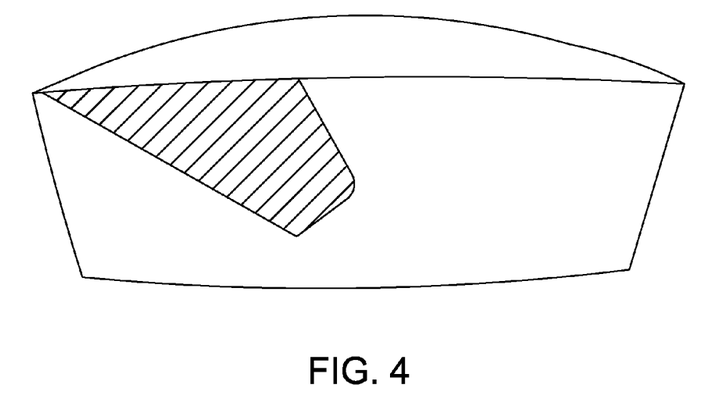
FIG. 4 presents an analysis of the quality of a crystal using a first comparative process.

FIG. 4 is a comparative example of a sapphire boule produced in a prior art vacuum furnace of the type shown in FIG. 2, but without the flow of a non-reactive gas. This yielded a sapphire boule as shown in FIG. 4 which is based upon a cross-section along the C axis of the boule. The cross-hatched portion of FIG. 4 depicts the small portion of that boule that meets the lattice distortion and scatter site requirements for the light-emitting diode application.

Figure 5:
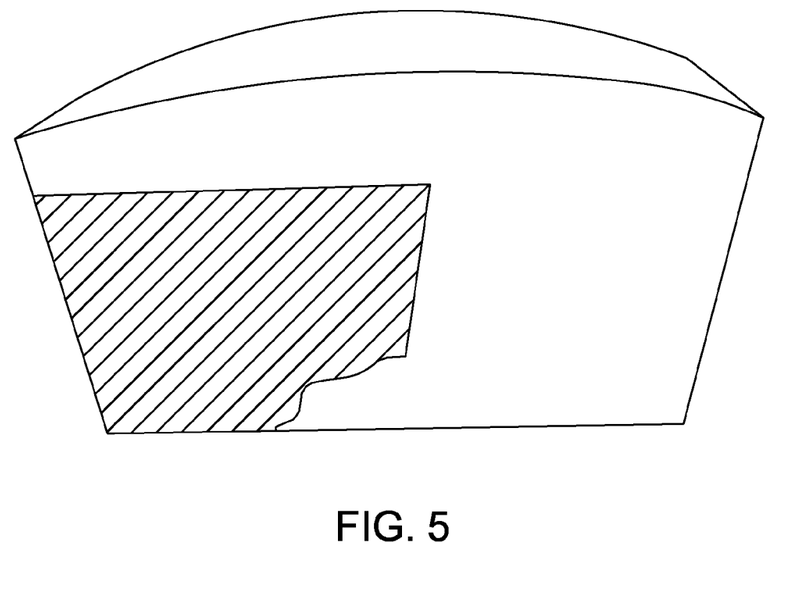
FIG. 5 presents an analysis of the quality of a crystal using a second comparative process.

FIG. 5 is another comparative example of a sapphire boule produced by an experiment in which the process for producing the boule of FIG. 4 was modified by adding helium into the furnace but without pressure control. The cross-hatched area represents that portion of the boule that did meet the lattice distortion and scatter site specifications and therefore could be used in the manufacture of light-emitting diodes. By inspection, this is a small percentage of the total boule volume. It also was found that the process cycle for the production of this boule was longer than the process cycle for the boule in FIG. 4.

Figure 6:
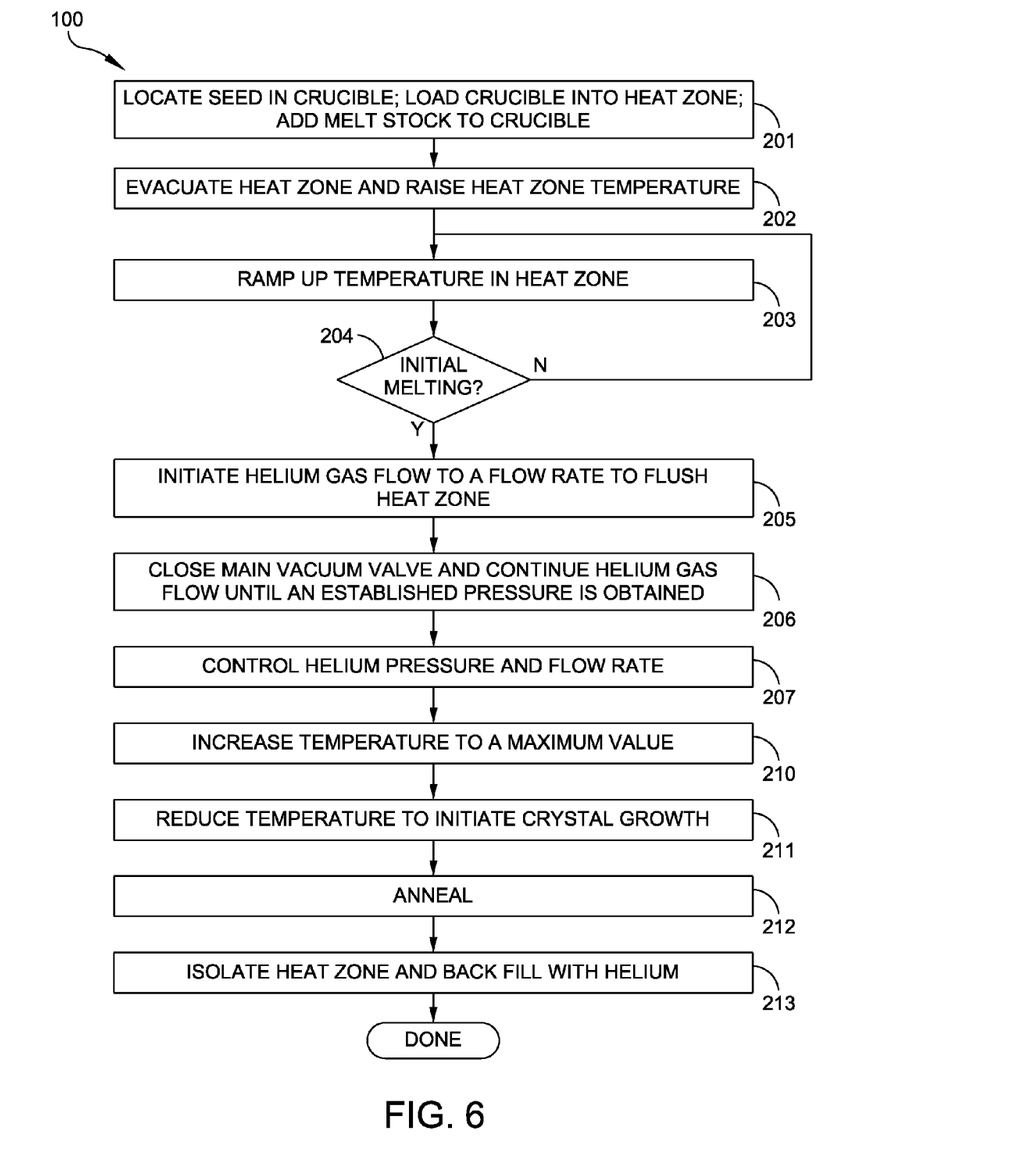
FIG. 6 is a basic flow diagram for a process control methodology incorporating this invention for the production of sapphire crystals.

FIG. 6 is a flow chart of a process for producing a sapphire crystal from alumina in accordance with this invention. Step 201 represents the physical requirements for (i) centering a seed in the crucible so that it remains in place, (ii) placing the crucible in a furnace and (iii) adding alumina melt stock to the crucible.

Step 202 is an initial stage involving the evacuation and initial heating of the furnace such that any major impurities can be removed by vacuum. Concurrently, a coolant gas, such as helium, beings to flow through a heat exchanger, such as the heat exchanger 64 in FIG. 2. Next, at step 203, the temperature in the heat zone continues to ramp up until melting is observed at step 204. The ramp can be determined and controlled by any number of known processes.

In this specific example, this determination is made by monitoring the emissivity from the top of the crucible. When melting occurs, the emissivity changes. Emissivity change detection devices are known in the art and they announce the onset of melting is a variety of ways. When this occurs, the process shifts into a melt stage.

At step 205 in the melt stage, helium gas flow through the furnace begins at a specified rate while the main vacuum valve, such as the main vacuum valve 52V in FIG. 2, is open to purge or flush the heat zone. This continues for a sufficient time to complete the flushing of impurities.

When the operations of step 205 are complete, in step 206 the main vacuum valve closes. Then helium flowing into the heat zone is now removed through a vacuum proportional valve that controls the pressure in the heat zone. The pressure is in the range of 5-50 Torr, preferably 10-30 Torr, and the flow rate is not greater than 1.0 SCFH, such as 0.05 to 1.0 SCFH including 0.1 to 0.5 SCFH. In accordance with this invention and as shown in step 207, this helium pressure and flow are controlled throughout the remainder of the cycle. It is believed that controlling this pressure and flow rate assures that unwanted ancillary reactions are suppressed and that impurities are flushed from the heat zone.

In step 210 the temperature is increased to a maximum value (e.g., a "seeding temperature") at which the melted alumina penetrates the seed. The rate of temperature increase and the duration of the process at this maximum temperature value is dependent upon a number of factors and experience.

At step 211 a growth stage begins by reducing the temperature in a controlled manner. Specifically, the helium flow through the heat exchanger (64 in FIG. 2) increases thereby removing heat from the crucible and its molten contents. The optimal rate of change of helium flow in the heat exchanger is determined experimentally, but once determined remains essentially reproducible for a given furnace. This heat extraction enables the directional solidification to occur thereby to produce the final crystal and continues until the temperature in the heat zone reaches an annealing point temperature. When the annealing temperature has been reached in step 212, the crystal is annealed. In step 213 the furnace is isolated and the helium continues to flow to backfill the heat zone. Thereafter the resulting crystal can be removed.

Example

Figure 7:
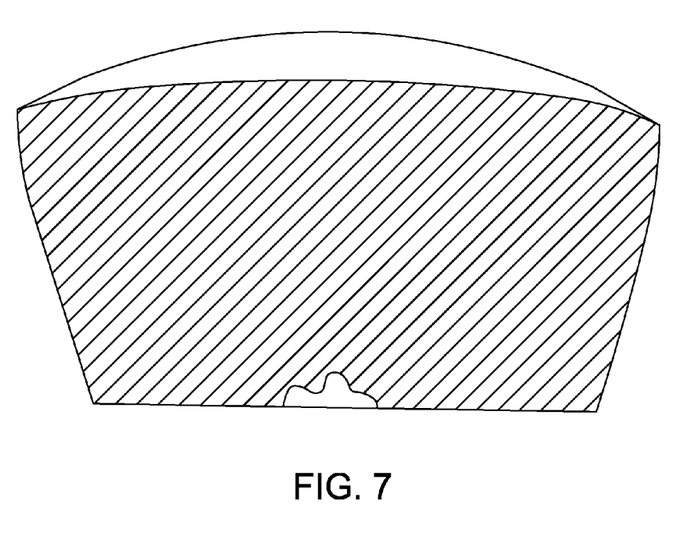
FIG. 7 presents an analysis of the quality of a sapphire crystal that is achieved by using this invention.

FIG. 7 is a cross-section along the C-axis of the boule produced using the process of FIG. 6. The lined area represents that portion of the boule that meets the minimum lattice distortion and scatter site specifications and therefore could be used could be used in the manufacture of light-emitting diodes. There is a significant increase in the useful volume over that shown in FIGS. 4 and 5. Moreover the useful volume in this boule exceeded both the lattice distortion and scatter site requirements. The cycle time for this improved product was about the same as the cycle time for the process run of FIG. 4.

From experience it is known that different furnaces may have different characteristics. Certain of those characteristics can result in changes during the growth stage and can adversely impact the quality of the final crystal. When it is determined that such conditions exist and could be overcome by modifying the constant nature of the heat transfer during the growth stage, temperature corrections can be made without changing the power supply settings. Specifically, it has been found that varying the helium pressure in the heat zone has the effect of changing the temperature in the heat zone with very good control. Thus while normally the established helium pressure may be constant, the pressure can be intentionally varied as required to effect such changes while still achieving the benefits of this invention, particularly during the growth stage.

As will now be apparent this invention provides many advantages by enabling the production of crystals, such as sapphire crystals, in vacuum furnaces whereby a significant portion of the grown crystal can meet or exceed requirements for lattice distortion and scatter in the crystal. A furnace that incorporates this invention provides an inert environment that minimizes the unwanted reactions typically encountered in high temperature environments such as unwanted reactions, decomposition, sublimation and vaporization. The use of this invention enables a high temperature process to operate at higher temperatures with a more uniform temperature in the heat zone. Higher pressures of the non-reactive gas provide better heat transfer for annealing crystals and for cooling faster by minimizing temperature gradients caused by hot and cold spots in the furnace. Minimizing hot spots can be achieved by increasing helium pressure within the zone to improve heat flow. Maintaining non-reactive flow rates also minimizes the reaction products that remain in the heat zone.

This invention has been disclosed in terms of certain embodiments. It will be apparent that many modifications can be made to the disclosed apparatus and process steps without departing from the invention. Therefore, it is the intent of the appended claims to cover all such variations and modifications as come within the true spirit and scope of this invention.

What is claimed is:

1. A method of producing a sapphire crystal, said method comprising the steps of:
   a) loading a crucible with alumina and an optional sapphire seed crystal into a heat zone of a furnace including a heat exchanger operated by flowing a coolant gas therethrough which is centrally positioned beneath the crucible in the heat zone;
   b) evacuating the heat zone of the furnace to remove impurities and to establish an operating pressure value;
   c) initiating operation of the heat exchanger by initiating flow of the coolant gas and heating the heat zone of the furnace to at least partially melt the alumina;
   d) further heating the heat zone of the furnace to a maximum temperature to fully melt the alumina and to partially melt the optional sapphire seed crystal;

e) growing the sapphire crystal from the fully melted alumina and further from the partially melted optional sapphire seed crystal by cooling the heat zone; and f) removing the sapphire crystal from the furnace, wherein, after step b) and prior to step e), the method further comprises the step of establishing a flow of a non-reactive gas through the heat zone at a controlled flow rate and at a controlled pressure that exceeds the operating pressure thereby to reduce defects in the sapphire crystal, wherein the method of producing the sapphire crystal is subject to a plurality of unwanted ancillary reactions, each ancillary reaction being characterized by a reaction vapor pressure and a reaction temperature and said method further comprises the steps of establishing a reaction temperature value dependent upon the reaction temperature for each unwanted ancillary reaction and establishing a reaction pressure value dependent upon the reaction vapor pressure for each ancillary reaction; and wherein, in step c), the heat zone of the furnace is heated to a temperature greater than each of the established reaction temperature values and, in step e), the controlled pressure is greater than the each of the reaction pressure values.

2. The method of claim 1, wherein the step of establishing the flow of the non-reactive gas occurs prior to step c).

3. The method of claim 1, wherein the step of establishing the flow of the non-reactive gas occurs after step c), said establishing of the flow of the non-reactive gas occurring with no substantial temperature increase.

4. The method of claim 1, wherein, in step a), the crucible has the sapphire seed crystal.

5. The method of claim 1, further comprising the step of annealing the sapphire crystal in the heat zone of the furnace while maintaining the controlled flow rate and controlled pressure of the non-reactive gas prior to step f).

6. The method of claim 1, further comprising the step of backfilling the heat zone with a gas prior to step f).

7. The method of claim 6, wherein the gas is the non-reactive gas.

8. The method of claim 1, wherein the non-reactive gas is taken from the group consisting of helium, argon, hydrogen and nitrogen.

9. The method of claim 1, wherein the non-reactive gas is helium.

10. The method of claim 9, wherein the controlled flow rate of the non-reactive gas is between about 0.1 and 0.5 SCFH.

11. The method of claim 1, wherein the controlled flow rate of the non-reactive gas is not greater than about 1.0 SCFH.

12. The method of claim 1, wherein the controlled pressure of the non-reactive gas is between about 5 and about 250 Torr.

13. The method of claim 1, wherein the coolant gas is helium.

14. The method of claim 1, wherein, in step c), the alumina is substantially fully melted.

15. The method of claim 1, wherein the controlled pressure of the non-reactive gas is between about 5 and about 50 Torr.

16. The method of claim 1, wherein, in step e), cooling the heat zone of the furnace comprises increasing the coolant gas flow to the heat exchanger.

17. The method of claim 1, wherein, in step e), cooling the heat zone of the furnace comprises varying the controlled pressure of the non-reactive gas.

18. The method of claim 1, wherein the controlled pressure of the non-reactive gas is between about 10 and about 30 Torr.

19. A method for stabilizing the environment in a heat zone of a high-temperature vacuum furnace for producing a sapphire crystal wherein the method is subject to a plurality of unwanted ancillary reactions, each ancillary reaction being characterized by a reaction vapor pressure and a reaction temperature, said method comprising:

A) establishing a reaction pressure value dependent upon the reaction vapor pressure for each ancillary reaction, B) directing gas through the heat zone wherein the gas has the characteristics of being non-reactive in the heat zone environment and of small molecular size, high specific heat and high heat conductivity, and C) regulating the pressure of the non-reactive gas in the heat zone to be at least the established reaction pressure value.

20. The method of claim 19, wherein the non-reactive gas is taken from the group consisting of argon, helium, hydrogen and nitrogen.

21. The method of claim 19, wherein the non-reactive gas is helium.

22. The method of claim 19, additionally comprising the step of controlled cooling of the crystal.

23. The method of claim 19, wherein said controlled cooling includes the step of maintaining a non-reactive gas pressure of at least the established reaction pressure value.

* * * * *